US012716941B2

(12) United States Patent
Liao et al.

(10) Patent No.: US 12,716,941 B2
(45) Date of Patent: Aug. 25, 2026

(54) BENCHMARK CIRCUIT ON A SEMICONDUCTOR WAFER AND METHOD FOR OPERATING THE SAME

(71) Applicant: TAIWAN SEMICONDUCTOR MANUFACTURING COMPANY LTD., Hsinchu (TW)

(72) Inventors: Chu-Feng Liao, Hsinchu (TW); Hung-Ping Cheng, Chiayi City (TW); Yuan-Yao Chang, Kaohsiung City (TW); Shuo-Wen Chang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 205 days.

(21) Appl. No.: 18/433,456

(22) Filed: Feb. 6, 2024

(65) Prior Publication Data

US 2024/0175920 A1 May 30, 2024

Related U.S. Application Data

(63) Continuation of application No. 17/378,280, filed on Jul. 16, 2021, now Pat. No. 11,927,628.

(51) Int. Cl.

*G01R 31/317* (2006.01)
*H01L 21/66* (2006.01)
*H10P 74/00* (2026.01)

(52) U.S. Cl.

CPC . *G01R 31/31722* (2013.01); *G01R 31/31723* (2013.01); *G01R 31/31724* (2013.01); *G01R 31/31725* (2013.01); *H10P 74/277* (2026.01)

(58) Field of Classification Search

None

See application file for complete search history.

(56) References Cited

U.S. PATENT DOCUMENTS

| | | | | |
|---|---|---|---|---|
| 10,935,597 | B2 * | 3/2021 | Kim | G01R 31/2856 |
| 11,876,024 | B2 * | 1/2024 | Chen | H01L 23/5256 |
| 11,927,628 | B2 * | 3/2024 | Liao | G01R 31/31725 |
| 12,117,489 | B2 * | 10/2024 | Chen | H03L 7/00 |
| 12,272,642 | B2 * | 4/2025 | Chen | H10D 89/921 |
| 2015/0212144 | A1 * | 7/2015 | Ouyang | H01L 22/14 324/762.01 |
| 2025/0314692 | A1 * | 10/2025 | Liao | G01R 31/2844 |

* cited by examiner

*Primary Examiner* — Jermele M Hollington

(74) *Attorney, Agent, or Firm* — WPAT LAW; Anthony King

(57) ABSTRACT

The present disclosure provides a semiconductor wafer. The semiconductor wafer includes: a scribe line between a first row of dies and a second row of dies, and a benchmark circuit disposed on the scribe line. The benchmark circuit includes a first switching circuit, a first process control monitoring (PCM) device and a second PCM device coupled to the first switching circuit, and a second switching circuit. The first switching circuit is configured to selectively couple the first PCM device and the second PCM device to receive a test signal, wherein the first PCM device and the second PCM device are configured to output a first output signal and a second output signal in response to the test signal, respectively. The second switching circuit is configured to selectively couple the first PCM device and the second PCM device to output the first output signal or the second output signal.

20 Claims, 10 Drawing Sheets

BENCHMARK CIRCUIT ON A SEMICONDUCTOR WAFER AND METHOD FOR OPERATING THE SAME

CROSS REFERENCE TO RELATED APPLICATIONS

This application is a continuation application of prior-filed U.S. application Ser. No. 17/378,280, filed Jul. 16, 2021, now U.S. Pat. No. 11,927,628 and claims the priority thereto.

BACKGROUND

In semiconductor industries, ring oscillator (RO) circuits are used to monitor a device's parameter changes in response to frequency or power variations. More ROs can increase the opportunity to reflect Si process issues. For High-Performance Computing (HPC), Internet of Things (IoT), mining systems, and GPU, among others, the wider bandwidth of RO frequency measurement is required. However, limited space on a wafer can constrain such measurement of RO frequencies.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
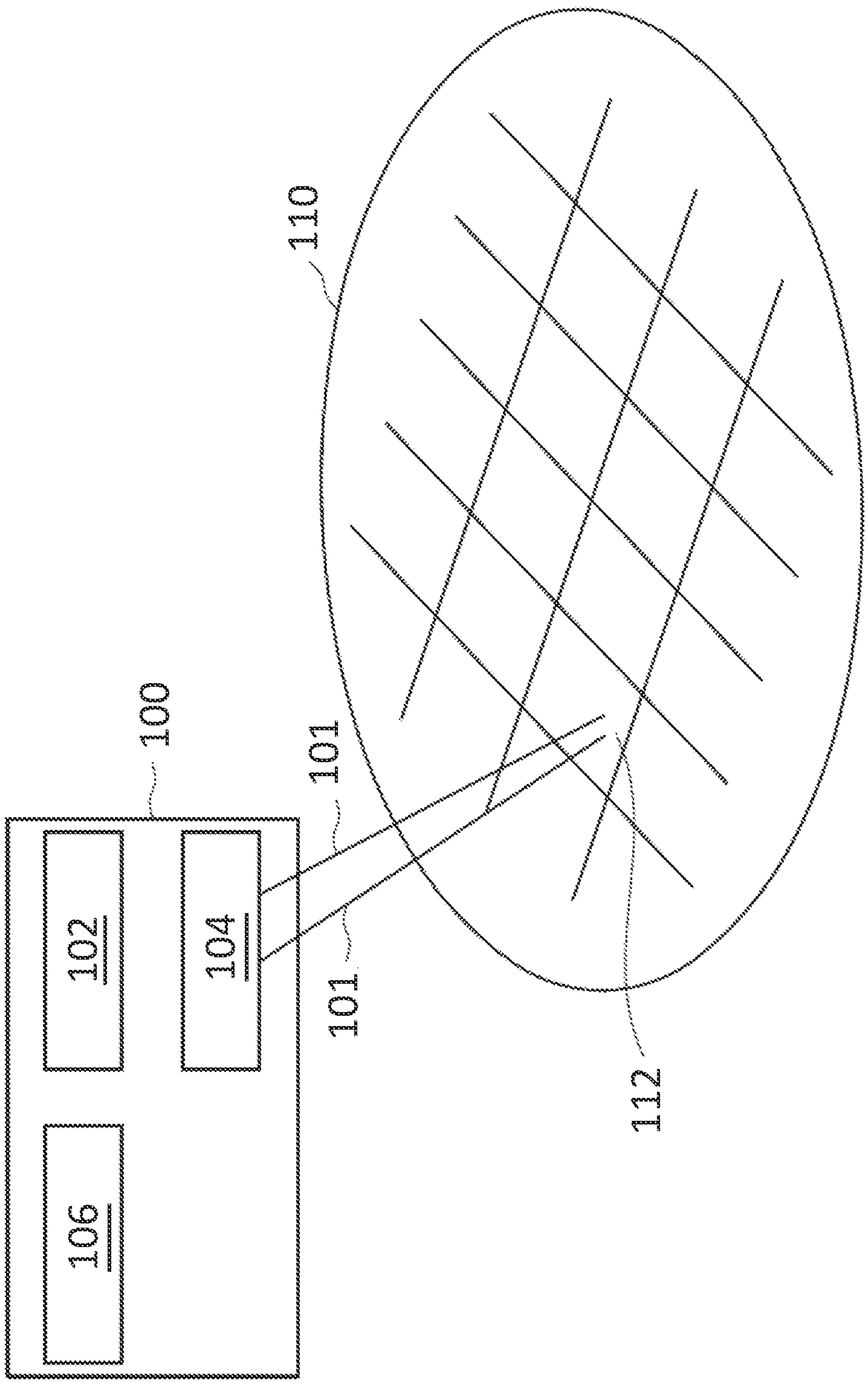
FIG. 1A is a diagram of a system for testing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In the following description, a signal is asserted with a logic high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1A is a diagram of a system 100 for testing a semiconductor device, in accordance with some embodiments of the present disclosure.

According to FIG. 1A, the system 100 is configured to test a semiconductor die formed on a wafer 110. The wafer 110 may comprise an elementary semiconductor such as silicon, germanium, or diamond. The wafer 110 may include one or more dies 112 formed thereon. Scribe lines can be provided between adjacent dies 112 so that the dies 112 can be separated by subsequent processing. In some embodiments, the dies 112 can be integrated circuits (ICs) or chips. The semiconductor wafer 110 may include a plurality of semiconductor dies 112 and several process control monitoring (PCM) devices (not shown in FIG. 1A). The semiconductor dies 112 will be shipped after manufacturing of the semiconductor wafer 110.

In an exemplary semiconductor fabrication process, the dies 112 may not be readily testable. Therefore, the PCM devices are provided to measure the parameter of the dies 112. The PCM devices can be used to monitor the characteristics of the dies 112. The PCM devices can be used to monitor the characteristics of the dies 112 during a wafer acceptance test (WAT). The PCM device can be formed in a scribe line, a street, or other locations not occupied by the actual components on the wafer 110.

In some embodiments, the system 100 can be test equipment. The system 100 may include hardware and software components that provide a suitable operational and functional environment for the tests. In some embodiments, the system 100 may include a signal generator 102, a coupler 104, and a monitor 106.

The signal generator 102 is configured to generate a test signal. It should be understood that other electrical signals such as data signals and clock signals can be provided to the PCM device corresponding to the die 112 (or to the die 112 directly) but are not illustrated for the sake of clarity and simplicity.

The coupler 104 is configured to couple the signal generator 102 to the PCM device on the wafer 110. In some embodiments, the coupler 104 can be coupled to the PCM device by a plurality of probes 101. The probes 101 can be part of a probe head or probe package (not shown). The probes 101 can be electrically coupled to test conductive contacts (pads) and/or bonding pads disposed on the PCM devices. The test conductive pads and/or bonding pads provide electrical connections to an interconnect structure (e.g., wiring) of the dies. For example, some of the probes can be coupled to pads that are associated with a supply terminal (e.g., Vdd) and ground terminal (e.g., Vss) of the PCM device. Other probes can be coupled to pads associated with input/output (I/O) terminals (e.g., data signals) of the PCM device. As such, the system 100 is operable to apply electrical signals to the PCM device and obtain response signals from the PCM device during WAT.

The monitor 106 is configured to determine whether the PCM device complies with a test criterion. The response signals can be evaluated by the monitor 106 with respect to the test criterion to determine whether a particular die 112 is defective or not via measuring the PCM device.

Figure 1B:
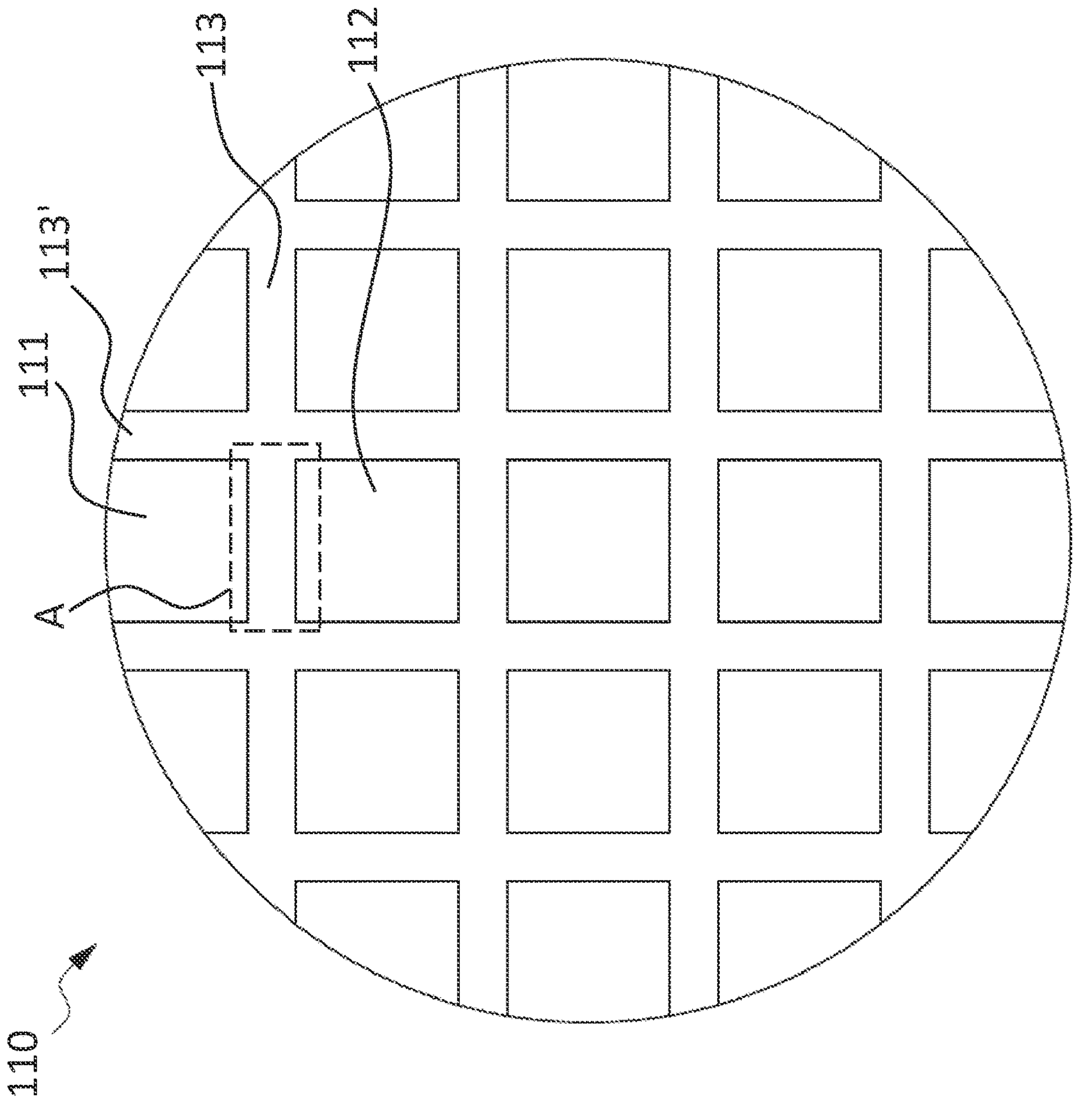
FIG. 1B is a top view of an example semiconductor wafer, in accordance with some embodiments of the present disclosure.

FIG. 1B is a top view of an example semiconductor wafer 110 in FIG. 1A, in accordance with some embodiments of the present disclosure. Referring to FIG. 1B, the semiconductor wafer 110 may include a plurality of dies (such as dies 111 and 112) arranged in a grid pattern, which includes a plurality of rows and columns of dies. Each row of the dies is separated by horizontal scribe lines 113, and each column of dies or chips are separated by vertical scribe lines 113'.

Individual dies 111 and 112 within the semiconductor wafer 110 may contain circuitry. The dies 111 and 112 can be separated by a sawing operation performed through the scribe lines (e.g., the horizontal scribe lines 113) and then packaged to form separated devices. The dies 111 and 112 on the semiconductor wafer 110 may include several basic circuit elements, which can be interconnected to form semiconductor devices to form logic or other functions. In some embodiments, the basic circuit elements may include active devices such as transistors and passive devices such as resistors, capacitors, inductors, or a combination thereof.

In an exemplary semiconductor fabrication process, each basic circuit element may need to be tested and evaluated at selected steps, or at the end, of the formation so as to maintain and assure the device quality. However, an individual basic circuit element may not be readily testable once integrated into a circuit. In order to verify that each basic circuit element has been fabricated according to design specification and exhibits selected properties or values, the PCM devices (not shown in FIG. 1B) can be used as an applicable quality control methodology.

The PCM devices include various basic circuit elements fabricated along with the actual basic circuit elements. Such PCM device may have properties or values similar to or the same as their counterparts since they are fabricated using the same operations. As such, the electrical characteristics (such as but not limited to a, test result, response to signal, performance parameter, etc.) of the PCM device can be applied to the non-tested basic circuit elements. The PCM devices can be formed in a scribe line, a street, or other locations not occupied by the actual components. Each PCM device can be coupled to the signal generator 102 through one or more test conductive pads exposed through the top surface of wafer.

The PCM devices can be referred to as devices-under-test (DUTs) throughout the present disclosure. The areas containing the PCM devices can be referred to as a process control monitor (PCM) test line or abbreviated as a test line throughout the present disclosure.

Figure 1C:
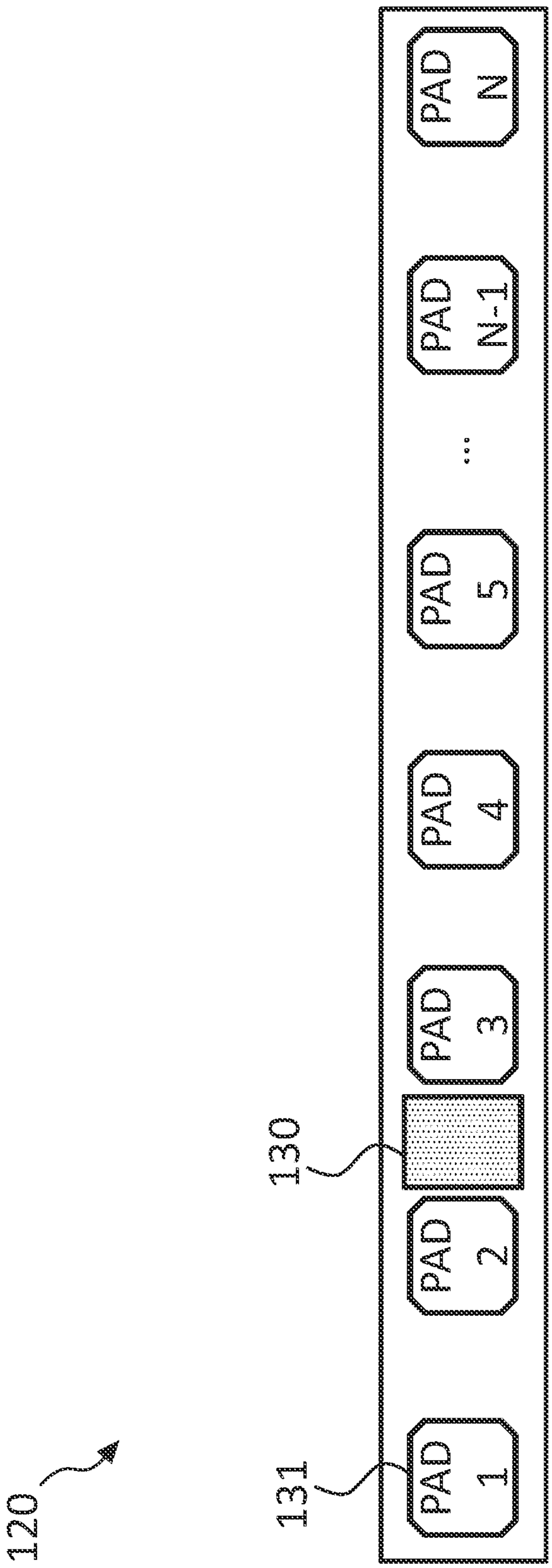
FIG. 1C is a diagram of a test line on the wafer, in accordance with some embodiments of the present disclosure.

FIG. 1C is a test line 120 on the wafer 110 in the FIGS. 1A and 1B, in accordance with some embodiments of the present disclosure. In some embodiments, the test line 120 in FIG. 1C can be a schematic block diagram of a portion of the semiconductor wafer 110 denoted by the dashed box A as shown in FIG. 1B. In some embodiments, one or more of the test lines 120 can be formed in the scribe lines 113. In some embodiments, one or more of the test lines 120 can be formed in the scribe lines 113'. In alternative embodiments, one or more of the test lines 120 can be formed inside the dies 111 and 112. In some embodiments, the test line 120 can be used to monitor the quality of wafer processing in manufacturing, for example, to observe the device variation on the semiconductor wafer 110.

The test line 120 may include one or more PCM devices 130 and one or more test conductive pads 131 exposed through the top surface of wafer. In some embodiments, the number of the test conductive pads depends on the design and area. For example, but not limited to, one test line 120 may include twenty-two test conductive pads. The test conductive pads can be coupled with a supply terminal (e.g., Vdd) or ground terminal (e.g., Vss) of the PCM device. Other test conductive pads can be coupled with input/output (I/O) terminals (e.g., data signals) of the PCM device. Therefore, the signal generator 102 may apply test signals to the PCM devices 130 through the test conductive pads 131, and the monitor 106 may obtain response signals from the PCM devices 130 through the test conductive pads 131 in the WAT. To measure different type semiconductor devices, the PCM device 130 may connect to one or more test conductive pads 131. In some embodiments, the PCM device 130 may connect to two test conductive pads 131. In other embodiments, the PCM device 130 may connect to five test conductive pads 131. In yet another embodiments, the PCM device 130 may connect to more than five test conductive pads 131.

Figure 2A:
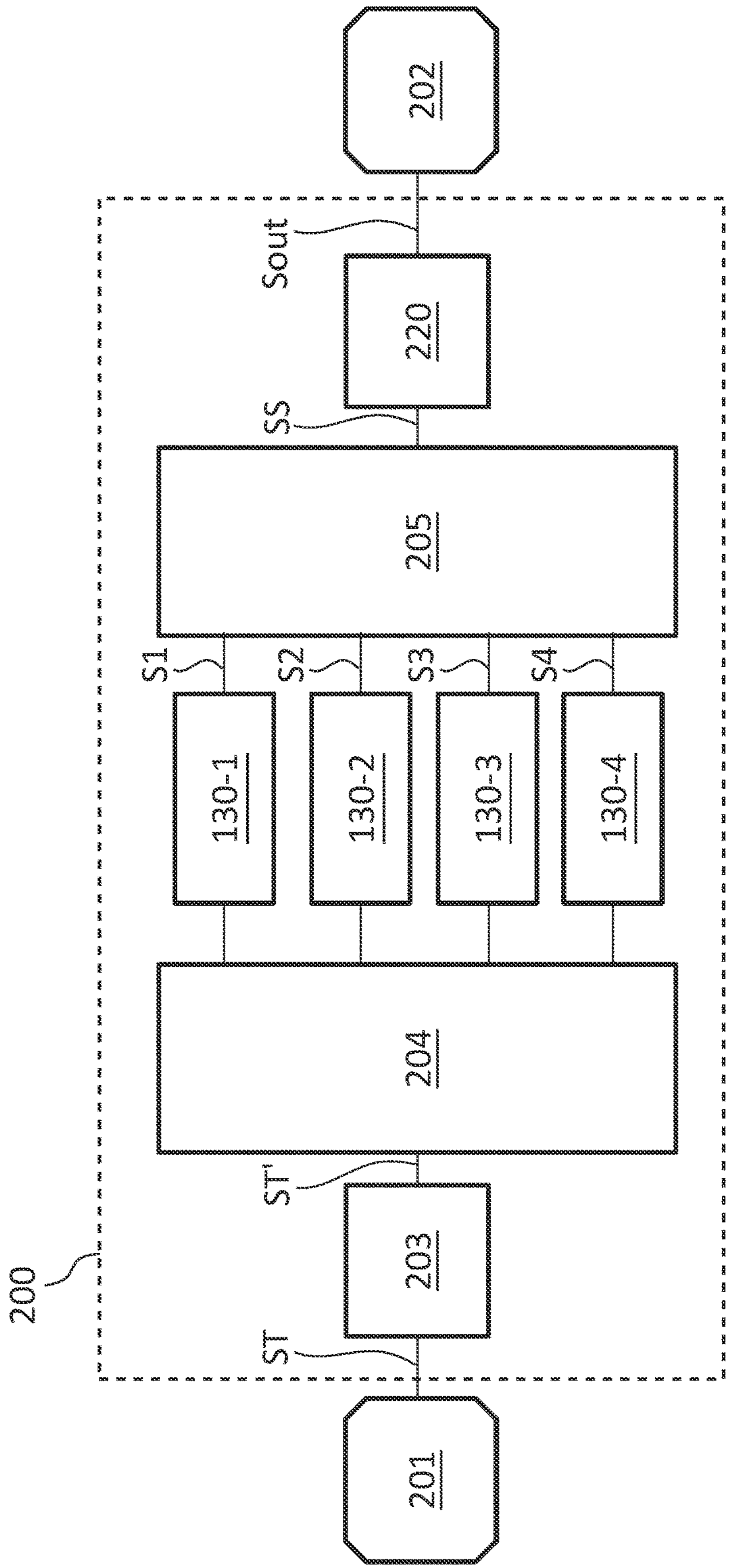
FIG. 2A shows an architecture of a benchmark circuit for testing the PCM devices on the wafer, in accordance with some embodiments of the present disclosure.

FIG. 2A shows an architecture of a benchmark circuit 200 for testing the PCM devices 130 on the wafer 110, in accordance with some embodiments of the present disclosure. In some embodiments, the benchmark circuit 200 can be formed in the test line 120. The benchmark circuit 200 can be coupled between a test conductive pad 201 and a test conductive pad 202. In some embodiments, the benchmark circuit 200 can be coupled to more test conductive pads based on the circuit design. In some embodiments, the test conductive pad 201 can be coupled to the signal generator 102 to receive a test signal. The benchmark circuit 200 in FIG. 2A includes a buffering circuit 203, two switching circuits 204 and 205, four PCM devices (DUTs) 130-1, 130-2, 130-3, and 130-4, and an adjustment circuit 220.

In some embodiments, the buffering circuit 203 can be coupled to the test conductive pad 201 to receive a test signal ST. The buffering circuit 203 may output an adjusted test signal ST' in response to the test signal ST. The buffering circuit 203 can be configured to adjust a voltage of the test signal ST' to be within a specific voltage range. The adjusted test signal ST' can be in a stable voltage range for the DUTs. In some embodiments, the buffering circuit 203 may output the adjusted test signal ST' to the DUTs 130-1, 130-2, 130-3, 130-4 through the switching circuit 204.

In some embodiments, the switching circuit 204 may selectively couple the test conductive pad 201 to one of the DUTs 130-1, 130-2, 130-3, or 130-4. The switching circuit 204 may selectively couple the test conductive pad 201 to one of the DUTs 130-1, 130-2, 130-3, or 130-4 through the buffering circuit 203. The switching circuit 204 may receive the adjusted test signal ST' and selectively transmit the adjust test signal ST' to one of the DUTs 130-1, 130-2, 130-3, or 130-4. In some embodiments, the switching circuit 204 is controlled by a control signal. For example, the switching circuit 204 can be controlled by a timing signal. In some embodiments, the switching circuit 204 can selectively couple the test conductive pad 201 to one of the DUTs 130-1, 130-2, 130-3, and 130-4 at different timings. In some embodiments, the timing signal can be provided by a D flip flop.

The benchmark circuit 200 includes one or more DUTs. For example, the benchmark circuit 200 includes four DUTs 130-1, 130-2, 130-3, and 130-4. The DUT 130-1 can be coupled between the switching circuits 204 and 205. The DUT 130-2 can be coupled between the switching circuits 204 and 205. The DUT 130-3 can be coupled between the switching circuits 204 and 205. The DUT 130-4 can be coupled between the switching circuits 204 and 205.

The DUT 130-1 can be coupled between the switching circuits 204 and 205 at timing T1. The DUT 130-2 can be coupled between the switching circuits 204 and 205 at timing T2. The DUT 130-3 can be coupled between the switching circuits 204 and 205 at timing T3. The DUT 130-4 can be coupled between the switching circuits 204 and 205 at timing T4.

The DUTs 130-1, 130-2, 130-3, and 130-4 may include various types of test circuits. In some embodiments, the DUTs 130-1, 130-2, 130-3, and 130-4 may include an oscillator. The oscillator can be a voltage-controlled oscillator (VCO) or a current-controlled oscillator (CCO). The oscillator can be a ring oscillator (RO).

In some embodiments, the DUT 130-1 may receive the adjusted test signal ST' from the buffering circuit 203 when the switching circuit 204 couple the DUT 130-1 to the buffering circuit 203. The DUT 130-1 may generate a signal S1 in response to the adjusted test signal ST', and transmit the signal S1 to the switching circuit 205. In some embodiments, the DUT 130-2 may receive the adjusted test signal ST' from the buffering circuit 203 when the switching circuit 204 couple the DUT 130-2 to the buffering circuit 203. The DUT 130-2 may generate a signal S2 in response to the adjusted test signal ST', and transmit the signal S2 to the switching circuit 205. In some embodiments, the DUT 130-3 may receive the adjusted test signal ST' from the buffering circuit 203 when the switching circuit 204 couple the DUT 130-3 to the buffering circuit 203. The DUT 130-3 may generate a signal S3 in response to the adjusted test signal ST', and transmit the signal S3 to the switching circuit 205. In some embodiments, the DUT 130-4 may receive the adjusted test signal ST' from the buffering circuit 203 when the switching circuit 204 couple the DUT 130-4 to the buffering circuit 203. The DUT 130-4 may generate a signal S4 in response to the adjusted test signal ST', and transmit the signal S4 to the switching circuit 205.

The DUTs 130-1, 130-2, 130-3, and 130-4 can be the same devices. In some embodiments, the DUTs 130-1, 130-2, 130-3, and 130-4 can be different devices. The signals S1, S2, S3, and S4 can be different. For example, the signals S1, S2, S3, and S4 may have different frequencies or amplitudes.

The switching circuit 205 may selectively couple one of the DUTs 130-1, 130-2, 130-3, or 130-4 to the test conductive pad 202. The switching circuit 205 can be coupled between the adjustment circuit 220 and the DUTs 130-1, 130-2, 130-3, and 130-4. The switching circuit 205 may selectively couple one of the DUTs 130-1, 130-2, 130-3, or 130-4 to the test conductive pad 202 through the adjustment circuit 220. The switching circuit 205 may selectively receive the signals S1, S2, S3, or S4 and transmit the selected signal SS to the adjustment circuit 220. That is, the selected signal SS can be the same as one of the signals S1, S2, S3, or S4. In some embodiments, the switching circuit 205 is controlled by a control signal. For example, the switching circuit 205 is controlled by a timing signal. In some embodiments, the switching circuit 205 can selectively couple one of the DUTs 130-1, 130-2, 130-3, and 130-4 to the test conductive pad 202 at different timings. In some embodiments, the timing signal can be provided by a D flip flop.

In some embodiments, the switching circuit 205 and the switching circuit 204 can be simultaneously controlled by a timing signal. In other words, the switching circuits 204 and 205 may both be coupled to the DUT 130-1 to form a conductive path between the test conductive pads 201 and 202. In some embodiments, the switching circuits 204 and 205 may both be coupled to the DUT 130-2 to form a conductive path between the test conductive pads 201 and 202. In some embodiments, the switching circuits 204 and 205 may both be coupled to the DUT 130-3 to form a conductive path between the test conductive pads 201 and 202. In some embodiments, the switching circuits 204 and 205 may both be coupled to the DUT 130-4 to form a conductive path between the test conductive pads 201 and 202.

The adjustment circuit 220 can be coupled between the switching circuit 205 and the test conductive pad 202. The adjustment circuit 220 can be coupled to the switching circuit 205 to receive the selected signal SS. In some embodiments, the adjustment circuit 220 may adjust the selected signal SS and output an output signal Sout to the test conductive pad 202. For example, the output signal Sout may have a frequency different from the selected signal SS. In some embodiments, the adjustment circuit 220 adjusts the frequency of the selected signal SS by a factor Q. In other words, the frequency of the output signal Sout is Q times the selected signal SS. The factor Q can be a positive value. The factor Q can be greater than one. The factor Q can be less than one.

In some embodiments, when the DUT 130-1 is selectively coupled to the adjustment circuit 220 to transmit the signal S1 through the switching circuit 205, the signal S1 can be adjusted by a first factor Q1. That is, the frequency of the output signal Sout can be Q1 times the signal S1. In some embodiments, when the DUT 130-2 is selectively coupled to the adjustment circuit 220 to transmit the signal S2 through the switching circuit 205, the signal S2 can be adjusted by a second factor Q2. That is, the frequency of the output signal Sout can be Q2 times the signal S2. In some embodiments, when the DUT 130-3 is selectively coupled to the adjustment circuit 220 to transmit the signal S3 through the switching circuit 205, the signal S3 can be adjusted by a third factor Q3. That is, the frequency of the output signal Sout can be Q3 times the signal S3. In some embodiments, when the DUT 130-4 is selectively coupled to the adjustment circuit 220 to transmit the signal S4 through the switching circuit 205, the signal S4 can be adjusted by a fourth factor Q4. That is, the frequency of the output signal Sout can be Q4 times the signal S4.

In some embodiments, the first factor Q1, second factor Q2, third factor Q3, and fourth factor Q4 can be the same. In some embodiments, the first factor Q1, second factor Q2, third factor Q3, and fourth factor Q4 may differ from each other. For example, the first factor Q1 can be different from the second factor Q2.

In some embodiments, the test conductive pad 202 may receive the output signal Sout from the adjustment circuit 220. The test conductive pad 202 can be coupled to the monitor 106 through the probes 101. The signals S1, S2, S3, and S4 can be in the detectable range of the monitor 106. In some embodiments, the signals S1, S2, S3, and S4 can be out of the detectable range of the monitor 106. For example, the signals S1, S2, S3, and S4 may have a frequency higher than a predetermined threshold frequency, and the monitor 106 cannot detect such high frequency. On the contrary, the signals S1, S2, S3, and S4 may have a frequency lower than a predetermined threshold frequency, and thus the monitor 106 cannot detect such low frequency. Therefore, the adjustment circuit 220 is provided to adjust the selected signal SS by multiple factors so that the output signal Sout can be in a detectable range of the monitor 106.

Figure 2B:
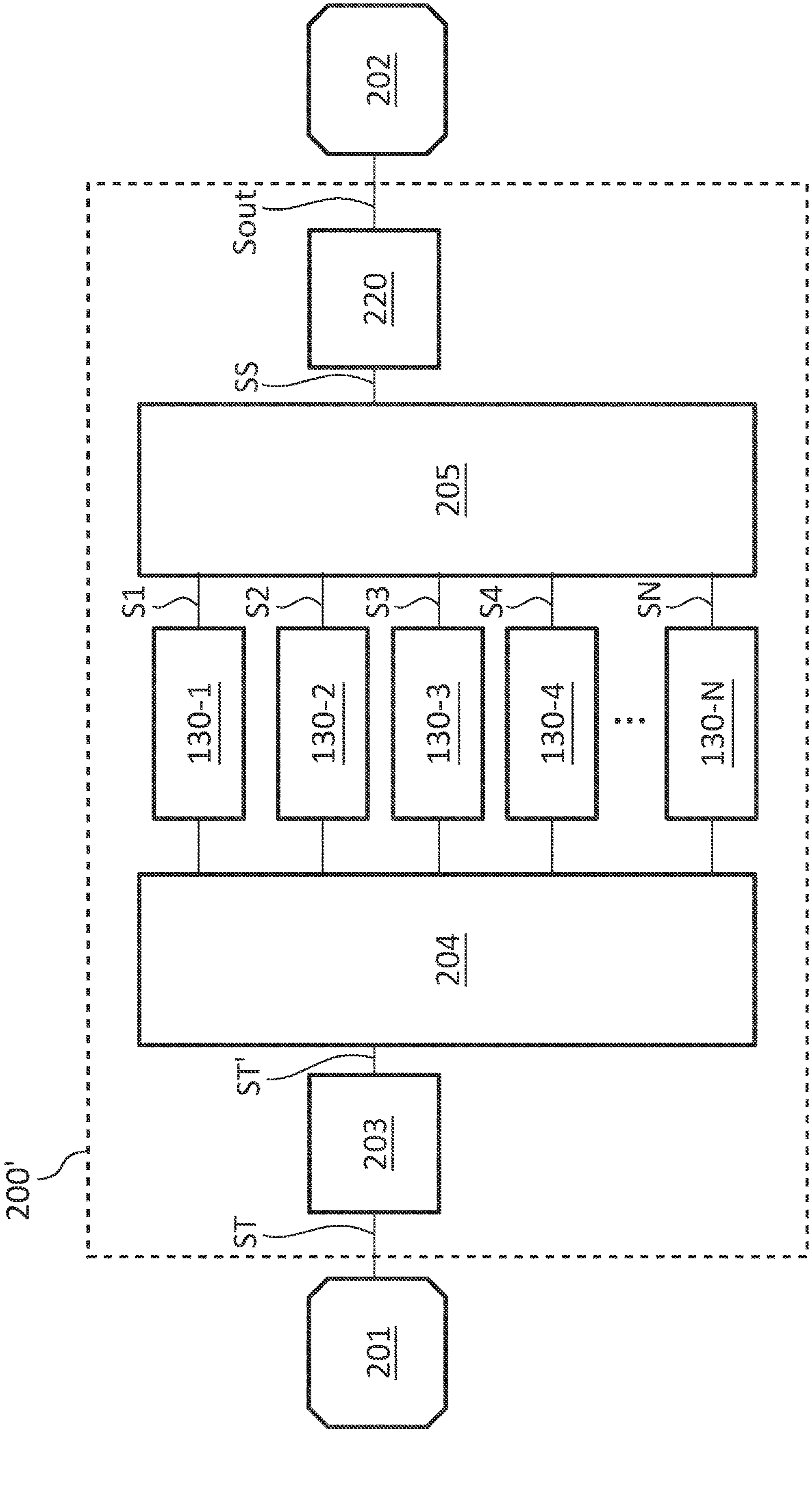
FIG. 2B shows an architecture of a benchmark circuit for testing the PCM devices on the wafer, in accordance with some embodiments of the present disclosure.

FIG. 2B shows an architecture of a benchmark circuit 200' for testing the PCM devices 130 on the wafer 110 in accordance with some embodiments of the present disclosure.

Referring to FIG. 2B, the benchmark circuit 200' is similar to the benchmark circuit 200 described and illustrated with reference to FIG. 2A. The difference lies in that the benchmark circuit 200' includes a number N of DUTs 130-1, 130-2, 130-3, 130-4, . . . and 130-N. The DUTs 130-1, 130-2, 130-3, 130-4, . . . or 130-N can be coupled between the switching circuits 204 and 205. In some embodiments, the DUTs 130-1, 130-2, 130-3, 130-4, . . . or 130-N may include an oscillator. The oscillator can be a voltage-controlled oscillator (VCO) or a current-controlled oscillator (CCO). The oscillator can be a ring oscillator (RO).

In some embodiments, the DUT 130-1 may receive signals when the switching circuit 204 couples to the DUT 130-1. The DUT 130-1 may generate a signal S1 in response to the adjusted test signal ST', and transmit the signal S1 to the switching circuit 205. In some embodiments, the DUT 130-2 may receive the adjusted test signal ST' from the buffering circuit 203 when the switching circuit 204 couple the DUT 130-2 to the buffering circuit 203. The DUT 130-2 may generate a signal S2 in response to the adjusted test signal ST', and transmit the signal S2 to the switching circuit 205. In some embodiments, the DUT 130-3 may receive the adjusted test signal ST' from the buffering circuit 203 when the switching circuit 204 couple the DUT 130-3 to the buffering circuit 203. The DUT 130-3 may generate a signal S3 in response to the adjusted test signal ST', and transmit the signal S3 to the switching circuit 205. In some embodiments, the DUT 130-4 may receive the adjusted test signal ST' from the buffering circuit 203 when the switching circuit 204 couple the DUT 130-4 to the buffering circuit 203. The DUT 130-4 may generate a signal S4 in response to the adjusted test signal ST', and transmit the signal S4 to the switching circuit 205. In some embodiments, the DUT 130-N may receive the adjusted test signal ST' from the buffering circuit 203 when the switching circuit 204 couple the DUT 130-N to the buffering circuit 203. The DUT 130-N may generate a signal SN in response to the adjusted test signal ST', and transmit the signal SN to the switching circuit 205. In other words, the DUTs may output a signal in response to the received signal.

The DUTs 130-1, 130-2, 130-3, 130-4, . . . and 130-N can be the same devices. In some embodiments, the DUTs 130-1, 130-2, 130-3, 130-4, . . . and 130-N can be different devices. The signals S1, S2, S3, S4, . . . and SN can be different. For example, the signals S1, S2, S3, S4, . . . and SN may have different frequencies or amplitudes.

In some embodiments, the switching circuit 204 may selectively couple the test conductive pad 201 to one of the DUTs 130-1, 130-2, 130-3, 130-4, . . . or 130-N. The switching circuit 204 may selectively couple the test conductive pad 201 to one of the DUTs 130-1, 130-2, 130-3, 130-4, . . . or 130-N through the buffering circuit 203.

In some embodiments, the switching circuit 205 may selectively couple one of the DUTs 130-1, 130-2, 130-3, 130-4, . . . or 130-N to the test conductive pad 202. The switching circuit 205 can be coupled between the adjustment circuit 220 and the DUTs 130-1, 130-2, 130-3, 130-4, . . . and 130-N. The switching circuit 205 may selectively couple one of the DUTs 130-1, 130-2, 130-3, 130-4, . . . or 130-N to the test conductive pad 202 through the adjustment circuit 220. The switching circuit 205 may selectively receive the signals S1, S2, S3, S4, . . . or SN and transmit the selected signal SS to the adjustment circuit 220. That is, the selected signal SS can be the same as one of the signals S1, S2, S3, S4, . . . or SN.

Figure 3A:
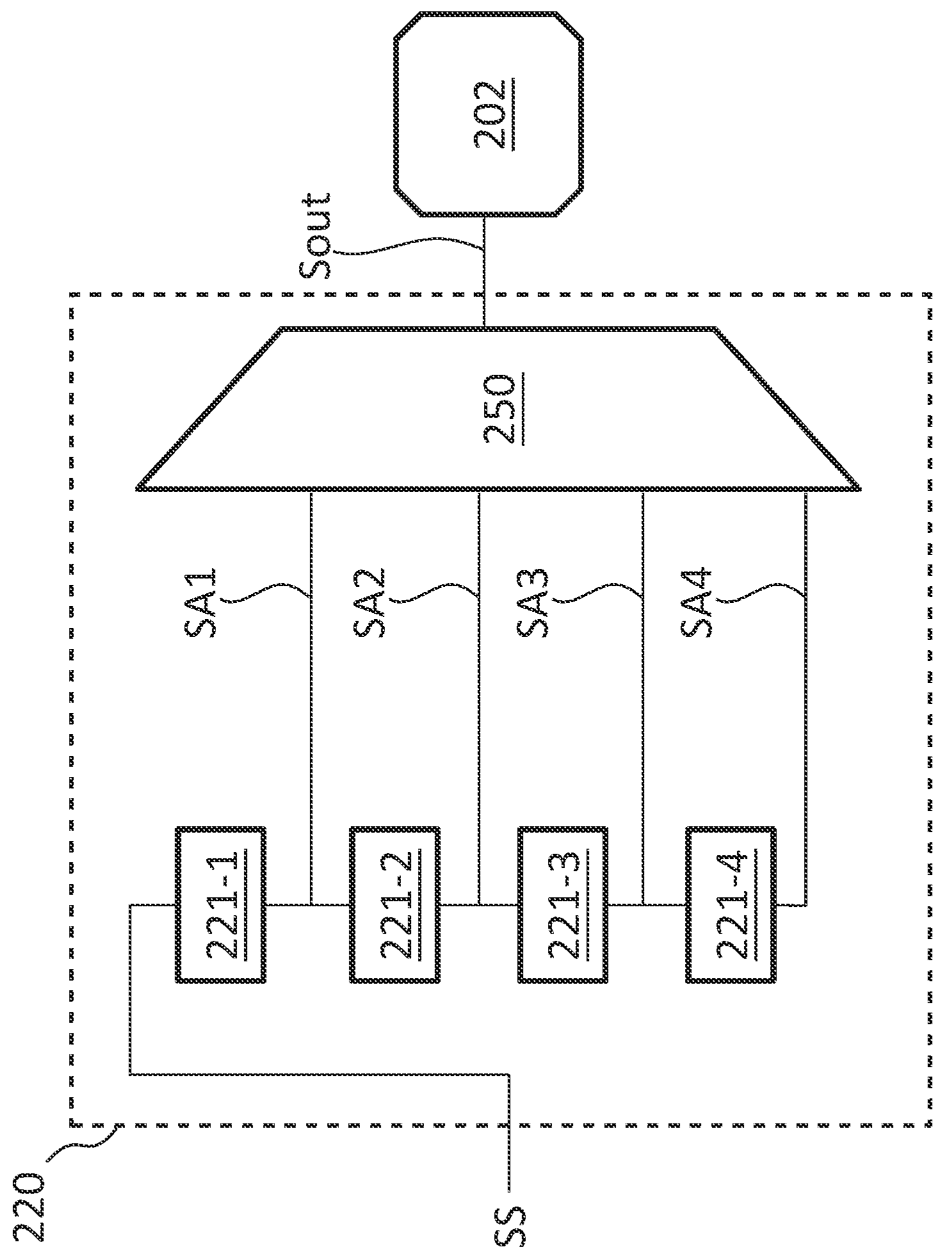
FIG. 3A shows an architecture of an adjustment circuit, in accordance with some embodiments of the present disclosure.

FIG. 3A shows an architecture of an adjustment circuit 220 shown in FIGS. 2A and 2B, in accordance with some embodiments of the present disclosure. As shown in FIG. 3A, the adjustment circuit 220 may include four adjusters 221-1, 221-2, 221-3, and 221-4, and a multiplexer (MUX) 250.

In some embodiments, the adjustment circuit 220 can be coupled to receive the selected signal SS. The adjuster 221-1 can be coupled to receive the selected signal SS. In some embodiments, the adjuster 221-1 can be coupled to the MUX 250. The adjuster 221-1 can be coupled to the adjuster 221-2. In some embodiments, the adjuster 221-1 may adjust the frequency of the selected signal SS by a scale factor K1. The adjuster 221-1 may generate an adjusted signal SA1 in response to the selected signal SS. For example, the frequency of the adjust signal SA1 can be K1 times the selected signal SS.

In some embodiments, the adjuster 221-2 may couple the adjuster 221-1 to receive the adjusted signal SAL. In some embodiments, the adjuster 221-2 can be coupled to the MUX 250. The adjuster 221-2 can be coupled to the adjuster 221-3. In some embodiments, the adjuster 221-2 may adjust the frequency of the adjusted signal SA1 by a scale factor K2. The adjuster 221-2 may generate an adjusted signal SA2 in response to the adjusted signal SAL. For example, the frequency of the adjust signal SA2 can be K2 times the adjusted signal SAL. That is, the frequency of the adjust signal SA2 can be K1*K2 times the selected signal SS.

In some embodiments, the adjuster 221-3 may couple the adjuster 221-2 to receive the adjusted signal SA2. In some embodiments, the adjuster 221-3 can be coupled to the MUX 250. The adjuster 221-3 can be coupled to the adjuster 221-4. In some embodiments, the adjuster 221-3 may adjust the frequency of the adjusted signal SA2 by a scale factor K3. The adjuster 221-3 may generate an adjusted signal SA3 in response to the adjusted signal SA2. For example, the frequency of the adjust signal SA3 can be K3 times the adjusted signal SA2. That is, the frequency of the adjust signal SA3 can be K1*K2*K3 times the selected signal SS.

In some embodiments, the adjuster 221-4 may couple the adjuster 221-3 to receive the adjusted signal SA3. In some embodiments, the adjuster 221-4 can be coupled to the MUX 250. In some embodiments, the adjuster 221-4 may adjust the frequency of the adjusted signal SA3 by a scale factor K4. The adjuster 221-4 may generate an adjusted signal SA4 in response to the adjusted signal SA3. For example, the frequency of the adjust signal SA4 can be K4 times the adjusted signal SA3. That is, the frequency of the adjust signal SA4 can be K1*K2*K3*K4 times the selected signal SS.

The adjusters 221-1, 221-2, 221-3, and 221-4 may have the same scale factor. In some embodiments, the adjusters 221-1, 221-2, 221-3, and 221-4 may have different scale factors. In other words, the scale factors K1, K2, K3, and K4 can be the same. In some embodiments, the scale factors K1, K2, K3, and K4 can be different. For example, the scale factor K1 can be larger than the scale factor K2, or the scale factor K1 can be smaller than the scale factor K2.

In some embodiments, the adjusters 221-1, 221-2, 221-3, and 221-4 can be multipliers. In some embodiments, the adjusters 221-1, 221-2, 221-3, and 221-4 can be dividers. For example, dividers 221-1, 221-2, 221-3, and 221-4 may have the same scale factor. In some embodiments, the dividers 221-1, 221-2, 221-3, and 221-4 may have different scale factors. For example, the scale factor K1 of the divider 221-1 can be $1/256$, and the output frequency of the divider 221-1 can be $1/256$ times the input frequency of the divider 221-1. That is, the frequency of the adjusted signal SA1, generated by the divider 221-1, can be $1/256$ times the selected signal SS. In some embodiments, the scale factor K2 of the divider 221-2 can be $1/2$, such that the output frequency of the divider 221-2 is $1/2$ times the input frequency of the divider 221-2. That is, the frequency of adjusted signal SA2, generated by the divider 221-2, can be $1/512$ times the selected signal SS. In some embodiments, the scale factor K3 of the divider 221-3 can be $1/4$, such that the output frequency of the divider 221-3 is $1/4$ times the input frequency of the divider 221-3. That is, the frequency of adjusted signal SA3, generated by the divider 221-3, can be $1/2048$ times the selected signal SS. In some embodiments, the scale factor K4 of the divider 221-4 can be $1/2$, such that the output frequency of the divider 221-4 is $1/2$ times the input frequency of the divider 221-4. That is, the frequency of adjusted signal SA4, generated by the divider 221-4, can be $1/4096$ times the selected signal SS.

The selected signal SS can be adjusted (divided or multiplied) into four adjusted signals SA1, SA2, SA3, and SA4. The MUX 250 may receive the adjusted signals SA1, SA2, SA3, and SA4. The MUX 250 may select from the adjusted signals SA1, SA2, SA3, and SA4. The MUX 250 may output an output signal Sout in response to the adjusted signals SA1, SA2, SA3, and SA4. In some embodiments, the MUX 250 may receive one or more selector inputs (not shown in FIG. 3A) to select from the adjusted signals SA1, SA2, SA3, and SA4. In some embodiments, the MUX 250 may select from the adjusted signals SA1, SA2, SA3, and SA4, and output (or forward) the selected signal, i.e., the output signal Sout. For example, the output signal Sout can be the same as one of the adjusted signals SA1, SA2, SA3, or SA4.

The test conductive pad 202 can be coupled to the MUX 250. In some embodiments, the test conductive pad 202 may receive the output signal Sout from the MUX 250 and transmit the output signal Sout to the monitor 106 (shown in FIG. 1A). The output signal Sout, selected from the adjusted signals SA1, SA2, SA3, and SA4, can be in the detectable range of the monitor 106. In some embodiments, the detectable range of the monitor 106 can be 1 kHz to 10 MHz. That is, the MUX 250 may select a signal having frequency in a range of 1 kHz to 10 MHz between the adjusted signals SA1, SA2, SA3, and SA4.

Figure 3B:
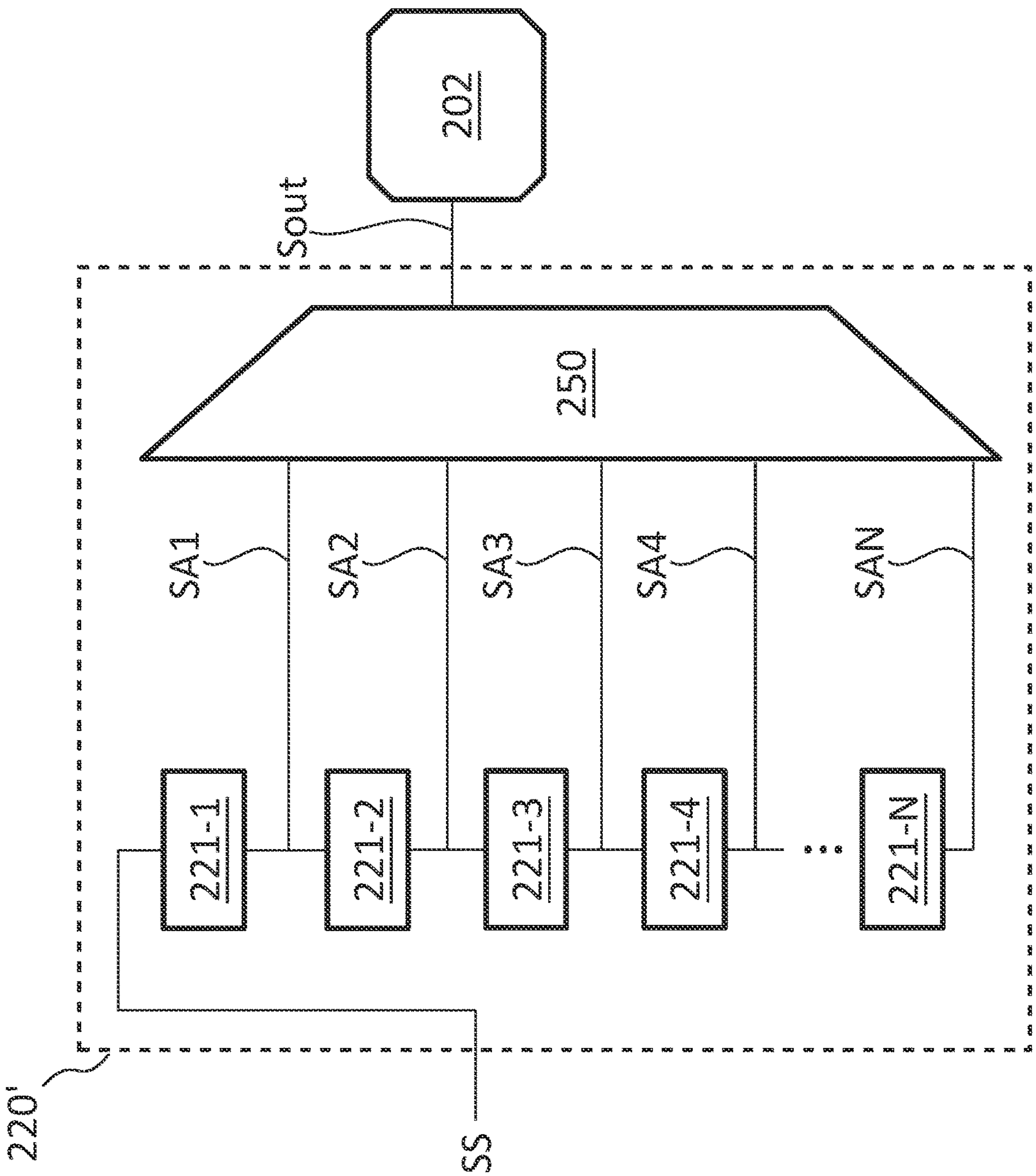
FIG. 3B shows an architecture of an adjustment circuit, in accordance with some embodiments of the present disclosure.

FIG. 3B shows an architecture of an adjustment circuit 220', in accordance with some embodiments of the present disclosure.

Referring to FIG. 3B, the adjustment circuit 220' is similar to the adjustment circuit 220 described and illustrated with reference to FIG. 3A. The difference lies in that the adjustment circuit 220' includes a number N of adjusters 221-1, 221-2, 221-3, 221-4, . . . and 221-N. The adjusters 221-1, 221-2, 221-3, 221-4, . . . and 221-N are coupled to receive the selected signal SS. In some embodiments, the adjusters 221-1, 221-2, 221-3, 221-4, . . . and 221-N can be coupled to the MUX 250. In some embodiments, each of the adjusters 221-1, 221-2, 221-3, 221-4, . . . and 221-N can be coupled to another adjuster. Each of adjusters 221-1, 221-2, 221-3, 221-4, . . . and 221-N may generate the adjusted signal to the MUX 250, respectively.

For example, the adjuster 221-1 may generate the adjusted signal SA1 in response to the selected signal SS, and transmit the adjusted signal SA1 to the MUX 250 and the adjuster 221-2. The adjuster 221-2 may generate the adjusted signal SA2 in response to the adjusted signal SA1, and transmit the adjusted signal SA2 to the MUX 250 and the adjuster 221-3. The adjuster 221-3 may generate the adjusted signal SA3 in response to the adjusted signal SA2, and transmit the adjusted signal SA3 to the MUX 250 and the adjuster 221-4. Similarly, the adjuster 221-N may generate the adjusted signal SAN in response to the adjusted signal SAN-1 (not shown in FIG. 3B), and transmit the adjusted signal SAN to the MUX 250.

The selected signal SS can be adjusted (divided or multiplied) into adjusted signals SA1, SA2, SA3, SA4, . . . and SAN. The MUX 250 may receive the adjusted signals SA1, SA2, SA3, SA4, . . . and SAN. The MUX 250 may select from the adjusted signals SA1, SA2, SA3, SA4, . . . and SAN. The MUX 250 may output an output signal Sout in response to the adjusted signals SA1, SA2, SA3, SA4, . . . and SAN. In some embodiments, the MUX 250 may receive one or more selector inputs (not shown in FIG. 3B) to select from the adjusted signals SA1, SA2, SA3, SA4, . . . and SAN. In some embodiments, the MUX 250 may select from the adjusted signals SA1, SA2, SA3, SA4, . . . and SAN, and output the selected signal, i.e., the output signal Sout. For example, the output signal Sout can be the same as one of the adjusted signals SA1, SA2, SA3, SA4, . . . and SAN.

Figure 4:
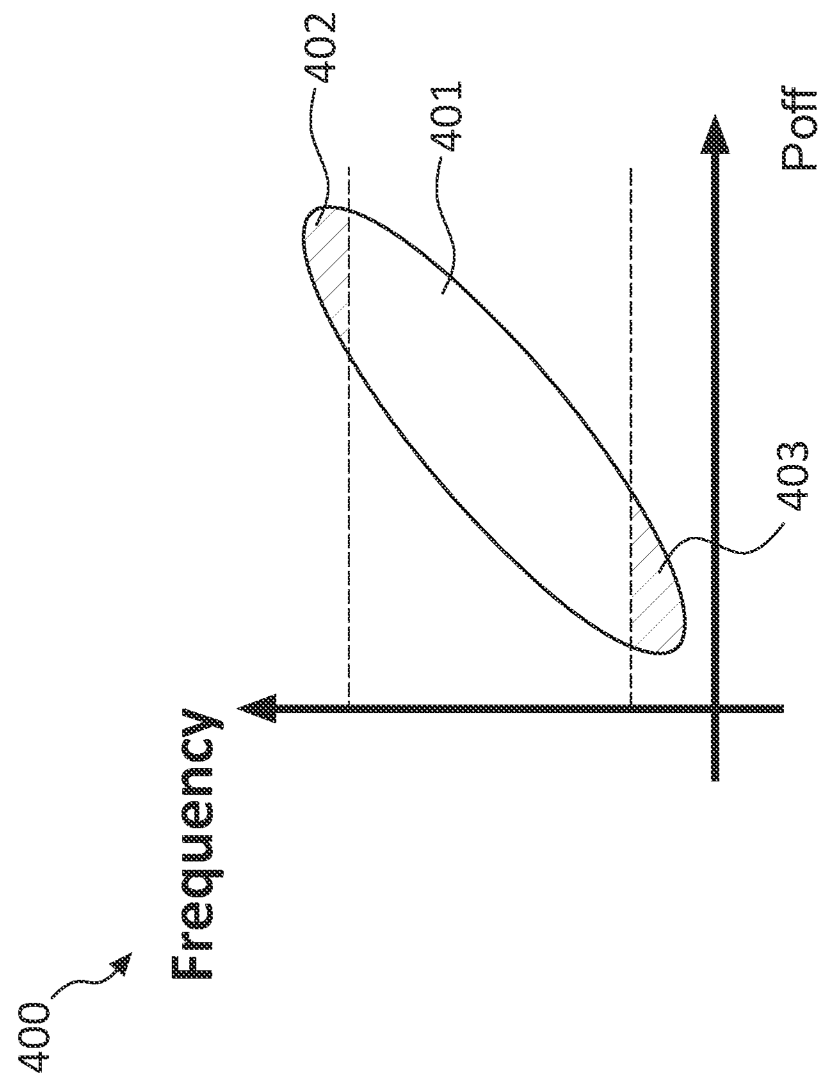
FIG. 4 is a graph illustrating the frequency versus the power loss, in accordance with some embodiments.

FIG. 4 is a graph 400 illustrating the frequency of the DUT versus the power loss of the DUT in accordance with some embodiments. Referring to FIG. 4, the x-axis represents the power loss (Poff) when the device is off. The y-axis represents the frequency, which the DUT can generate. In some embodiments, the DUT includes a ring-oscillator.

As illustrated, the frequency is higher when the Poff is high. The frequency would be lower, however, when the Poff is low. In some embodiments, the performance of the DUT is shown in the graph 400. In some embodiments, the graph 400 includes three regions 401, 402, and 403. The region 401 represents a detectable range of frequency between the upper limit and the lower limit. The frequency of the DUT can be detected, evaluated in this range. In some embodiments, the range can be the detectable range of the monitor 106. For example, the upper limit can be 10 MHz, and the lower limit can be 1 kHz. That is, the frequency of the region 401 can be between 1 kHz to 10 MHz.

The region 402 has a frequency higher than the upper limit. For example, the DUT may generate a frequency higher than the upper limit with high applied voltage. In some embodiments, the ring-oscillator, included in the DUT, may generate high frequency for evaluating the performance of the device under high applied voltage (HVDD). For example, the HVDD device may include HPC devices. In some embodiments, the measurement result of the device in the region 402 can be distorted since the frequency is out of the range of the monitor 106. The data distortion may occur when evaluating the device in region 402. Therefore, the present disclosure may adjust the higher frequency in region 402 by the adjustment circuit 220 in FIGS. 2A and 2B into a suitable frequency for evaluation. For example, the adjustment circuit 220 may divide the frequency in the region 402 into the detectable range between the upper limit and the lower limit.

The region 403 is of a frequency lower than the lower limit. For example, the DUT may generate a frequency lower than the lower limit with low applied voltage. In some embodiments, the ring-oscillator, included in the DUT, may generate low frequency for evaluating the performance of the device under low applied voltage (LVDD). For example, the LVDD device may include IoT devices. In some embodiments, the measurement result of the device in the region 403 can be distorted since the frequency is out of the range of the monitor 106. The data distortion may occur when evaluating the device in region 403. Therefore, the present disclosure may adjust the low frequency of region 403 by the adjustment circuit 220 in FIGS. 2A and 2B into a suitable frequency for evaluation. For example, the adjustment circuit 220 may multiply the frequency in the region 403 into the detectable range between the upper limit and the lower limit.

Comparing to the existing practice, the benchmark circuit 200 in FIGS. 2A and 2B may save area of the wafer. The buffering circuit 203 requires large space. With the switching circuits controlled by the D flip flop, the DUTs in the benchmark circuit 200 share one buffering 203, and thus the space can be reduced. In addition, the adjustment circuit 220 in FIGS. 2A-2B and 3A-3B includes several adjusters to adjust the frequency of the signal generated by the DUTs, while there is only one adjuster (divider or multiplier) for each DUT in the current practice. Sharing one adjustment circuit 220 may also save space. Moreover, the present disclosure provides a multi-adjuster which can adjust the frequency into several frequency, so that it could be applicable to much more DUTs and could adjust the frequency to a suitable range.

Figure 5:
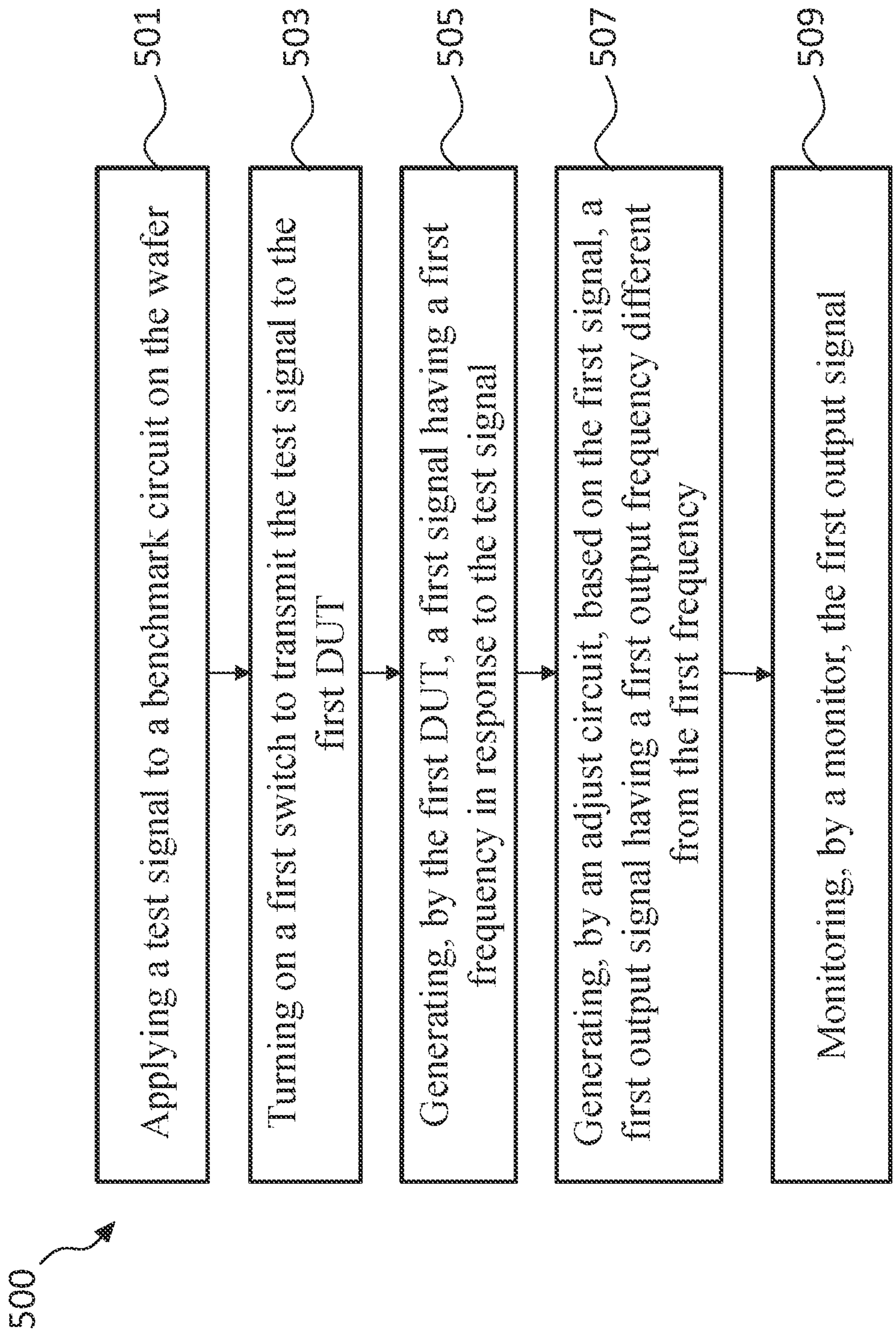
FIG. 5 illustrates a flow chart including operations for measuring characteristics of a wafer, in accordance with some embodiments of the present disclosure.

FIG. 5 illustrates a flow chart including operations for measuring characteristics of a wafer in accordance with some embodiments of the present disclosure. FIG. 5 shows a flow chart 500. The flow chart 500 in FIG. 5 includes operations 501, 503, 505, 507, and 509. The method 500 can be operated by the benchmark circuit 200 shown in FIGS. 2A and 2B.

In the operation 501, a test signal is applied to a benchmark circuit on the wafer. The test signal can be transmitted through the probes to the test conductive pads on the wafer. In some embodiments, the test signal can be applied to the benchmark circuit 200 in FIGS. 2A and 2B, which includes one or more DUTs. In some embodiments, the benchmark circuit 200 can be located in a scribe line of the wafer. In some embodiments, the test signal can be transmitted to the DUTs of the benchmark circuit 200 through the buffering circuit 203.

In the operation 503, a first switch is turned on to transmit the test signal to a first DUT of the DUTs in the benchmark circuit 200. For example, the first DUT can be the DUT 130-1. In some embodiments, the benchmark circuit 200 include the switching circuits 204 coupled to the DUTs to selectively transmit the test signal to one of the DUTs. The benchmark circuit 200 may include the switching circuit 205 coupled to the same DUT of the DUTs. The switching circuit 205 and the switching circuit 204 is simultaneously controlled by a timing signal. For example, the switching circuits 204 and 205 can be both coupled to the first DUT 130-1. In some embodiments, the first switch can be referred as the switching circuits 204 and 205 coupled to the first DUT 130-1 to form a circuit.

In the operation 505, the first DUT 130-1 may generate a first signal S1 having a first frequency in response to the test signal. In some embodiments, the first DUT 130-1 may include an oscillator. The oscillator can be a voltage-controlled oscillator (VCO) or a current-controlled oscillator (CCO). The oscillator can be a ring oscillator (RO). The oscillator 130-1 may generate the first signal S1, which has the first frequency. In some embodiments, the first signal S1 can be transmitted to an adjustment circuit 220 through the switching circuit 205.

In the operation 507, the adjustment circuit 220 may generate a first output signal based on the first signal S1, where the first output signal has a first output frequency different from the first frequency. In some embodiments, the adjustment circuit 220 may adjust the first frequency of the first signal S1 to the first frequency of the first output signal. The adjusted signal, i.e., the first output signal, can be in the detectable range of the monitor 106 so that the performance of the first DUT 130-1 could be evaluated.

In some embodiments, the adjustment circuit 220 may include a frequency adjuster and a MUX. In some embodiments, the frequency adjuster can be a frequency divider or a frequency multiplier. For example, the frequency divider may include one or more dividers 221-1, 221-2, 221-3, and 221-4 in FIGS. 3A and 3B. In some embodiments, the frequency divider of the adjustment circuit 220 may divide the first frequency into one or more adjusted frequencies. Referring to FIG. 3A, the first frequency of the first signal S1 can be divided into the adjusted signals SA1, SA2, SA3, and SA4. The adjusted signals SA1, SA2, SA3, and SA4 may have frequency different from each other. On the contrary, the frequency multiplier may include one or more multipliers 221-1, 221-2, 221-3, and 221-4 in FIGS. 3A and 3B. In some embodiments, the frequency multiplier of the adjustment circuit 220 may multiply the first frequency to be one or more adjusted frequencies. Referring to FIG. 3A, the first frequency of the first signal S1 can be multiplied to be the adjusted signals SA1, SA2, SA3, and SA4. The adjusted signals SA1, SA2, SA3, and SA4 may have frequency different from each other.

The MUX 250 of the adjustment circuit 220 may receive one or more adjusted signals SA1, SA2, SA3, and SA4. In some embodiments, the MUX 250 of the adjustment circuit 220 may select the first output frequency from the adjusted frequencies, where the first output frequency of the first output signal is in an applicable range of the monitor 106.

In operation 509, the monitor 106 in FIG. 1A may monitor the first output signal. In some embodiments, the first output signal can be transmitted to the monitor 106 through the test conductive pads and the probes. The monitor 106 may evaluate the output signal to determine the performance of the device on the wafer.

In another embodiment, a second switch can be turned on to transmit the test signal to a second DUT of the DUT of the benchmark circuit 200. For example, the second DUT can be the DUT 130-2. In some embodiments, the switching circuits 204 and 205 can be controlled by the timing signal to be both coupled to the second DUT 130-2. In some embodiments, the second switch can be referred as the switching circuits 204 and 205 coupled to the second DUT 130-2 to form a circuit. Accordingly, the method 500, including operations 501, 503, 505, 507, and 509 can be performed to evaluate the second DUT 130-2.

The method 500 can be performed on each DUT in the benchmark circuit 200 until all DUTs are evaluated. In some embodiments, the operations 501, 503, 505, 507, and 509 described above can be performed on each DUT.

Figure 6:
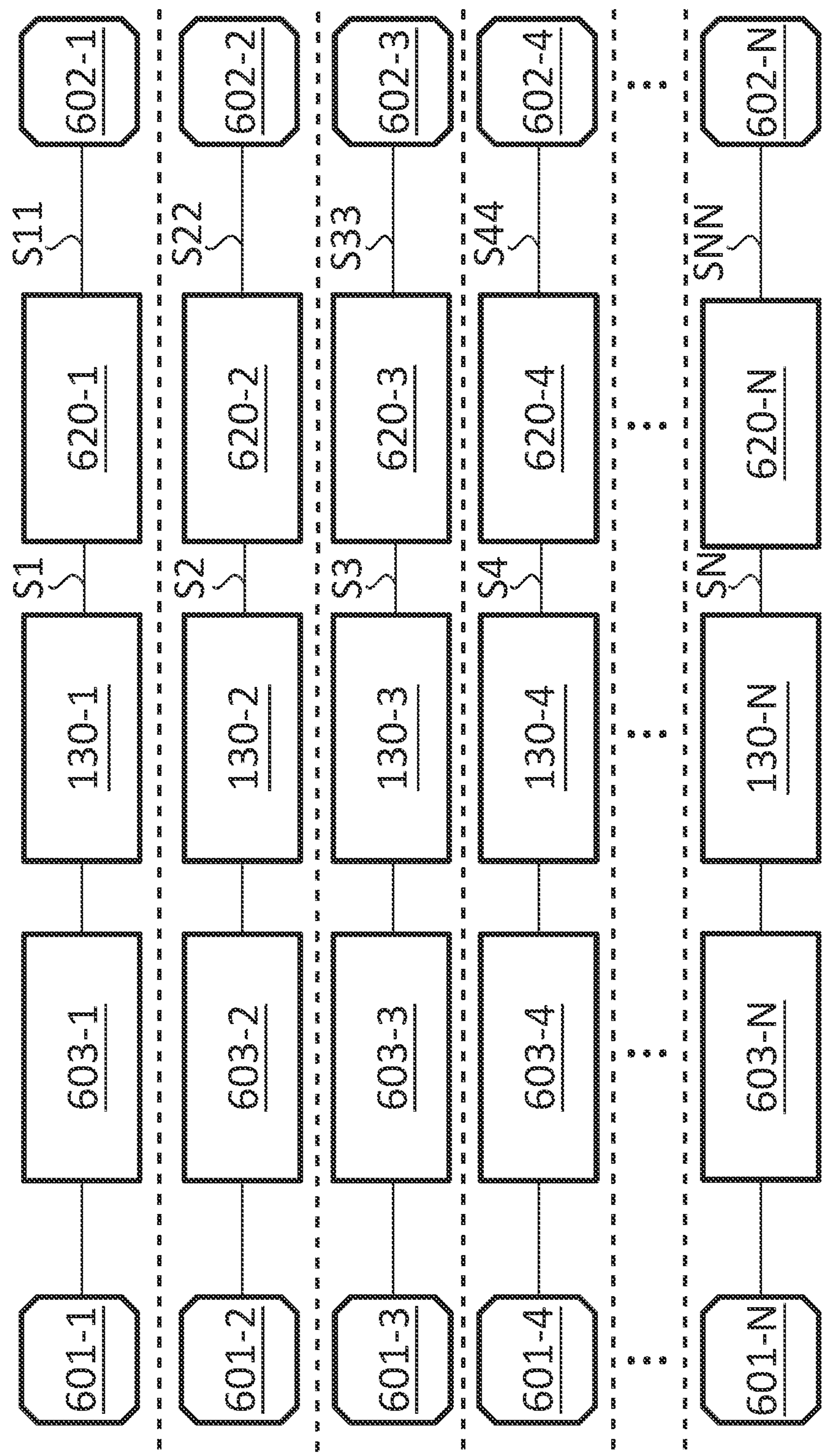
FIG. 6 shows an architecture of benchmark circuits for testing the PCM devices on the wafer, in accordance with some comparative embodiments of the present disclosure.

FIG. 6 shows an architecture of one or more benchmark circuit for testing the PCM devices 130 on the wafer in accordance with some comparative embodiments of the present disclosure.

As shown in the first row in FIG. 6, the first benchmark circuit may include two test conductive pads 601-1 and 602-1, a buffering circuit 603-1, a DUT 130-1, an adjuster 620-1. As shown in the second row in FIG. 6, the second benchmark circuit may include two test conductive pads 601-2 and 602-2, a buffering circuit 603-2, a DUT 130-2, an adjuster 620-2. As shown in the third row in FIG. 6, the third benchmark circuit may include two test conductive pads 601-3 and 602-3, a buffering circuit 603-3, a DUT 130-3, an adjuster 620-3. As shown in the fourth row in FIG. 6, the fourth benchmark circuit may include two test conductive pads 601-4 and 602-4, a buffering circuit 603-4, a DUT 130-4, an adjuster 620-4. As shown in the last row in FIG. 6, the Nth benchmark circuit may include two test conductive pads 601-N and 602-N, a buffering circuit 603-N, a DUT 130-N, an adjuster 620-N. In some embodiments, each DUT in FIG. 6 may couple to an individual buffering circuit and an individual adjuster. In some embodiments, the benchmark circuits can be formed in the test line 120 on the wafer.

The DUT 130-1 of the first benchmark circuit is coupled between the test conductive pads 601-1 and 602-1. In some embodiments, the DUT 130-1 can be coupled to more test conductive pads based on the circuit design. In some embodiments, the test conductive pad 601-1 can be coupled to receive a test signal. The test signal can be transmitted to the buffering circuit 603-1. The operations of the buffering circuit 603-1 can be referred to the buffering circuit 203 in FIGS. 2A and 2B and is omitted here for brevity. The DUT 130-1 is described in FIGS. 2A and 2B and is omitted here for brevity.

In some embodiments, the DUT 130-1 can be coupled between the buffering circuit 603-1 and the adjuster 620-1. The adjuster 620-1 can be a frequency divider or a frequency multiplier. In some embodiments, the adjuster 620-1 may receive the signal S1, generated by the DUT 130-1 in response to the test signal. In some embodiments, the adjuster 620-1 may adjust (divide or multiply) the frequency of the signal S1 to be an adjusted signal S11. For example, the adjuster 620-1 may adjust the frequency of the signal S1 by a scale factor Q. In other words, the frequency of the adjusted signal S11 is Q times the signal S1. In some embodiments, the adjuster 620-1 can be coupled to the test conductive pad 602-1 to transmit the adjusted signal S11. The adjusted signal S11 can be transmitted to the monitor 106 through the test conductive pad 602-1 and probes, such that the monitor 106 may evaluate the performance of the devices on the wafer.

The DUT 130-2 of the second benchmark circuit is coupled between the test conductive pads 601-2 and 602-2. In some embodiments, the DUT 130-2 can be coupled to more test conductive pads based on the circuit design. In some embodiments, the test conductive pad 601-2 can be coupled to receive a test signal. The test signal can be transmitted to the buffering circuit 603-2. The operations of the buffering circuit 603-2 can be referred to the buffering circuit 203 in FIGS. 2A and 2B and is omitted here for brevity. The DUT 130-2 is described in FIGS. 2A and 2B and is omitted here for brevity.

In some embodiments, the DUT 130-2 can be coupled between the buffering circuit 603-2 and the adjuster 620-2. The adjuster 620-2 can be a frequency divider or a frequency multiplier. In some embodiments, the adjuster 620-2 may receive the signal S2, generated by the DUT 130-2 in response to the test signal. In some embodiments, the adjuster 620-2 may adjust (divide or multiply) the frequency of the signal S2 to be an adjusted signal S22. For example, the adjuster 620-2 may adjust the frequency of the signal S2 by a scale factor Q. In other words, the frequency of the adjusted signal S22 is Q times the signal S2. In some embodiments, the adjuster 620-2 can be coupled to the test conductive pad 602-2 to transmit the adjusted signal S22. The adjusted signal S22 can be transmitted to the monitor 106 through the test conductive pad 602-2 and probes, such that the monitor 106 may evaluate the performance of the devices on the wafer.

The DUT 130-3 of the third benchmark circuit is coupled between the test conductive pads 601-3 and 602-3. In some embodiments, the DUT 130-3 can be coupled to more test conductive pads based on the circuit design. In some embodiments, the test conductive pad 601-3 can be coupled to receive a test signal. The test signal can be transmitted to the buffering circuit 603-3. The operations of the buffering circuit 603-3 can be referred to the buffering circuit 203 in FIGS. 2A and 2B and is omitted here for brevity. The DUT 130-3 is described in FIGS. 2A and 2B and is omitted here for brevity.

In some embodiments, the DUT 130-3 can be coupled between the buffering circuit 603-3 and the adjuster 620-3. The adjuster 620-3 can be a frequency divider or a frequency multiplier. In some embodiments, the adjuster 620-3 may receive the signal S3, generated by the DUT 130-3 in response to the test signal. In some embodiments, the adjuster 620-3 may adjust (divide or multiply) the frequency of the signal S3 to be an adjusted signal S33. For example, the adjuster 620-3 may adjust the frequency of the signal S3 by a scale factor Q. In other words, the frequency of the adjusted signal S33 is Q times the signal S3. In some embodiments, the adjuster 620-3 can be coupled to the test conductive pad 602-3 to transmit the adjusted signal S33. The adjusted signal S33 can be transmitted to the monitor 106 through the test conductive pad 602-3 and probes, such that the monitor 106 may evaluate the performance of the devices on the wafer.

The DUT 130-4 of the fourth benchmark circuit is coupled between the test conductive pads 601-4 and 602-4. In some embodiments, the DUT 130-4 can be coupled to more test conductive pads based on the circuit design. In some embodiments, the test conductive pad 601-4 can be coupled to receive a test signal. The test signal can be transmitted to the buffering circuit 603-4. The operations of the buffering circuit 603-4 can be referred to the buffering circuit 203 in FIGS. 2A and 2B and is omitted here for brevity. The DUT 130-4 is described in FIGS. 2A and 2B and is omitted here for brevity.

In some embodiments, the DUT 130-4 can be coupled between the buffering circuit 603-4 and the adjuster 620-4. The adjuster 620-4 can be a frequency divider or a frequency multiplier. In some embodiments, the adjuster 620-4 may receive the signal S4, generated by the DUT 130-4 in response to the test signal. In some embodiments, the adjuster 620-4 may adjust (divide or multiply) the frequency of the signal S4 to be an adjusted signal S44. For example, the adjuster 620-4 may adjust the frequency of the signal S4 by a scale factor Q. In other words, the frequency of the adjusted signal S44 is Q times the signal S4. In some embodiments, the adjuster 620-4 can be coupled to the test conductive pad 602-4 to transmit the adjusted signal S44. The adjusted signal S44 can be transmitted to the monitor 106 through the test conductive pad 602-4 and probes, such that the monitor 106 may evaluate the performance of the devices on the wafer.

The DUT 130-N of the $N^{th}$ benchmark circuit is coupled between the test conductive pads 601-N and 602-N. In some embodiments, the DUT 130-N can be coupled to more test conductive pads based on the circuit design. In some embodiments, the test conductive pad 601-N can be coupled to receive a test signal. The test signal can be transmitted to the buffering circuit 603-N. The operations of the buffering circuit 603-N can be referred to the buffering circuit 203 in FIGS. 2A and 2B and is omitted here for brevity. The DUT 130-N is described in FIGS. 2A and 2B and is omitted here for brevity.

In some embodiments, the DUT 130-N can be coupled between the buffering circuit 603-N and the adjuster 620-N. The adjuster 620-N can be a frequency divider or a frequency multiplier. In some embodiments, the adjuster 620-N may receive the signal SN, generated by the DUT 130-N in response to the test signal. In some embodiments, the adjuster 620-N may adjust (divide or multiply) the frequency of the signal SN to be an adjusted signal SNN. For example, the adjuster 620-N may adjust the frequency of the signal SN by a scale factor Q. In other words, the frequency of the adjusted signal SNN is Q times the signal SN. In some embodiments, the adjuster 620-N can be coupled to the test conductive pad 602-N to transmit the adjusted signal SNN. The adjusted signal SNN can be transmitted to the monitor 106 through the test conductive pad 602-N and probes, such that the monitor 106 may evaluate the performance of the devices on the wafer.

According to FIG. 6, the DUTs 130-1, 130-2, 130-3, 130-4, . . . , and 130-N are arranged similarly. In some embodiments, the scale factor Q of the adjusters 620-1, 620-2, 620-3, 620-4, . . . and 620-N can be the same. In some embodiments, the scale factor Q of the adjusters 620-1, 620-2, 620-3, 620-4, . . . and 620-N can be different. In some embodiments, a scribe line may include four benchmark circuits due to the limited area. In some embodiments, the adjuster 620-1 merely include one scale factor. In this case, it will be hard to detect the frequency of the signal S1 once the DUT 130-1 generate a frequency is out of the detectable range of the monitor, and thus the monitor 106 can be inaccurate.

The existing practice may include merely four DUTs in one test line, since the large area of the buffering circuit and the amount of the test conductive pads. The buffering circuit requires a larger area. In some embodiments, there are twenty-two test conductive pads included in each test line due to the limited area. Moreover, take RO for example, it requires five test conductive pads for evaluating one RO. In the existing practice, each RO can be coupled to respective buffering circuit and adjuster. In this case, four RO require twenty test conductive pads and four buffering circuit and four adjusters. Therefore, the existing practice may merely include four ROs in one test line.

The subject disclosure provides the benchmark circuit 200 in FIGS. 2A and 2B may save area. With the switching circuits 204 and 205 controlled by the D flip flop, the DUTs in the benchmark circuit 200 share one buffering 203, one adjustment circuit 220, and the required test conductive pads. Take RO for example, the ROs in the benchmark circuit 200 share one buffering 203, one adjustment circuit 220, and five test conductive pads. In some embodiments, there can be about two hundred ROs in one test line. That is, the amount of ROs in one test line of the subject disclosure can be 50 times the existing practice. Therefore, the subject disclosure can reduce area and cost.

In addition, the adjustment circuit 220 in FIGS. 2A-2B and 3A-3B includes several adjusters to adjust the frequency of the signal generated by the DUTs. Sharing one adjustment circuit 220 may also save area. Moreover, the present disclosure provides a multi-adjuster which can adjust the frequency into several frequency, so that it could be applicable to much more DUTs and could adjust the frequency to a suitable range.

In some embodiments, the present disclosure provides a semiconductor wafer. The semiconductor wafer includes: a scribe line between a first row of dies and a second row of dies; and a benchmark circuit disposed adjacent to the scribe line and electrically coupled to a first conductive contact and a second conductive contact. The benchmark circuit includes a first device-under-test (DUT); a second DUT; a first switching circuit configured to selectively couple the first DUT and the second DUT to the first conductive contact (PAD); and a second switching circuit configured to selectively couple the first DUT and the second DUT to the second conductive contact.

In some embodiments, the present disclosure provides a benchmark circuit embedded on a semiconductor wafer. The benchmark circuit includes a buffering circuit; a number N of ring oscillators; an adjustment circuit; a first switching circuit configured to selectively connect one of the number N of oscillators to the buffering circuit; and a second switching circuit configured to selectively connect one of the number N of oscillators to the adjustment circuit.

In some embodiments, the present disclosure provides a method for testing a wafer. The method includes: applying a test signal to a benchmark circuit on the wafer, wherein the benchmark circuit including a first DUT and a second DUT; turning on a first switch to transmit the test signal to the first DUT; generating, by the first DUT, a first signal having a first frequency in response to the test signal; generating, by an adjustment circuit, based on the first signal, a first output signal having a first output frequency different from the first frequency; and monitoring, by a monitor, the first output signal.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor wafer, comprising:
- a conductive contact;
- a benchmark circuit, comprising:
  - a first switching circuit;
  - a second switching circuit;
  - a first process control monitoring (PCM) device coupled between the first switching circuit and the second switching circuit;
  - a second PCM device coupled between the first switching circuit and the second switching circuit; and
  - an adjustment circuit coupled to the second switching circuit,
  - wherein the first switching circuit is configured to selectively couple the first PCM device or the second PCM device to the conductive contact to receive a test signal from the conductive contact, wherein the second switching circuit is configured to selectively couple the first PCM device or the second PCM device to obtain an output signal from the first PCM device or the second PCM device in response to the test signal,
  - wherein the adjustment circuit configured to adjust the output signal, wherein the adjustment circuit comprises:
    - a first adjuster connected to the second switching circuit, the first adjuster configured to adjust a frequency of the output signal of the first PCM device to be a first adjusted signal when the second switching circuit configured to selectively couple to the first PCM device; and
    - a second adjuster connected to the first adjuster and configured to adjust a frequency of the first adjusted signal to be a second adjusted signal.

2. The semiconductor wafer of claim 1, wherein the first PCM device includes a ring oscillator, and the second PCM device includes a ring oscillator.

3. The semiconductor wafer of claim 1, wherein the first switching circuit and the second switching circuit are configured to be simultaneously coupled to the first PCM device or the second PCM device.

4. The semiconductor wafer of claim 1, wherein a scale factor of the second adjuster is different from a scale factor of the first adjuster.

5. The semiconductor wafer of claim 4, wherein the adjust circuit further includes a third adjuster connected to the second adjuster and configured to adjust a frequency of the second adjusted signal to be a third adjusted signal, wherein a scale factor of the third adjuster is the same as a scale factor of the second adjuster.

6. The semiconductor wafer of claim 1, wherein the first adjuster is a frequency multiplier or a frequency divider.

7. The semiconductor wafer of claim 1, wherein the adjustment circuit further comprises a multiplexer (MUX) coupled to the first adjuster and the second adjuster, wherein the MUX is configured to selectively output the first adjusted signal or the second adjusted signal.

8. The semiconductor wafer of claim 1, wherein the benchmark circuit further comprises a buffering circuit coupled to the first switching circuit, wherein the buffering circuit is configured to adjust a voltage of the test signal.

9. A benchmark circuit, comprising:
- a first PCM device;
- a second PCM device;
- a first switching circuit configured to selectively couple the first PCM device and the second PCM device to receive a test signal from an external signal generator;
- a second switching circuit configured to selectively couple the first PCM device or the second PCM device to obtain an output signal from the first PCM device or the second PCM device; and
- an adjustment circuit coupled to the second switching circuit and configured to adjust the output signal, wherein the adjustment circuit comprises:
  - a first adjuster connected to the second switching circuit, the first adjuster configured to adjust a frequency of the output signal of the first PCM device to be a first adjusted signal when the second switching circuit configured to selectively couple to the first PCM device; and
  - a second adjuster connected to the first adjuster and configured to adjust a frequency of the first adjusted signal to be a second adjusted signal.

10. The benchmark circuit of claim 9, wherein the first PCM device includes a ring oscillator, and the second PCM device includes a ring oscillator.

11. The benchmark circuit of claim 9, wherein the first switching circuit and the second switching circuit are configured to be simultaneously coupled to the first PCM device or the second PCM device.

12. The benchmark circuit of claim 9, wherein the first adjuster is a frequency multiplier or a frequency divider.

13. The benchmark circuit of claim 9, wherein the adjustment circuit further comprises a multiplexer (MUX) coupled to the first adjuster and the second adjuster, wherein the MUX is configured to selectively output the first adjusted signal or the second adjusted signal.

14. The benchmark circuit of claim 9, wherein the benchmark circuit further comprises a buffering circuit coupled between the first switching circuit and the first conductive contact, wherein the buffering circuit is configured to adjust a voltage of the test signal.

15. A semiconductor wafer, comprising:
- a conductive contact; and
- a benchmark circuit embedded on the semiconductor wafer, the benchmark circuit comprising:
  - a number N of oscillators;
  - a first frequency divider;
  - a first switching circuit configured to selectively connect one of the number N of oscillators to the conductive contact to receive a test signal; and
  - a second switching circuit configured to selectively connect one of the number N of oscillators to the first frequency divider.

16. The semiconductor wafer of claim 15, wherein the first switching circuit and the second switching circuit are configured to be simultaneously coupled to one of the number N of oscillators in response to a timing signal.

17. The semiconductor wafer of claim 15, further comprising a buffering circuit coupled to the first switching circuit and configured to adjust a voltage of the test signal.

18. The semiconductor wafer of claim 15, wherein one of the number N of oscillators is configured to output a first output signal in response to the test signal, and wherein the first frequency divider is configured to divide a frequency of the first output signal to be a first adjusted signal.

19. The semiconductor wafer of claim 18, further comprising a second frequency divider connected to the first frequency divider, wherein the second frequency divider is configured to divide a frequency of the first adjusted signal to be a second adjusted signal.

20. The semiconductor wafer of claim 19, further comprising a multiplexer (MUX) coupled to the first frequency divider and the second frequency divider, and wherein the MUX is configured to selectively output the first adjusted signal or the second adjusted signal.

* * * * *